(12) United States Patent
Fiedler

(10) Patent No.: US 7,580,495 B2
(45) Date of Patent: Aug. 25, 2009

(54) MIXER-BASED PHASE CONTROL

(75) Inventor: Alan Fiedler, Mountain View, CA (US)

(73) Assignee: SLT Logic LLC, Boston, MA (US)

( * ) Notice: Subject to any disclaimer, the term of this patent is extended or adjusted under 35 U.S.C. 154(b) by 60 days.

(21) Appl. No.: 11/172,419

(22) Filed: Jun. 30, 2005
(Under 37 CFR 1.47)

(65) Prior Publication Data
US 2007/0230618 A1 Oct. 4, 2007

(51) Int. Cl.
*H04L 7/00* (2006.01)
(52) U.S. Cl. ...................................... 375/371
(58) Field of Classification Search ................. 375/362, 375/371, 373–376; 327/147–148, 156–157; 331/16–17
See application file for complete search history.

(56) References Cited

U.S. PATENT DOCUMENTS

| | | | |
|---|---|---|---|
| 4,277,754 A | 7/1981 | Minakuchi | |
| 4,922,141 A | 5/1990 | Lofgren et al. | |
| 5,638,014 A | 6/1997 | Kurita | |
| 5,815,041 A | 9/1998 | Lee et al. | |
| 5,825,210 A | 10/1998 | Oh | |
| 5,901,184 A | 5/1999 | Ben-Efraim et al. | |
| 5,999,793 A | 12/1999 | Ben-Efraim et al. | |
| 6,078,200 A * | 6/2000 | Miyano | 327/142 |
| 6,091,931 A | 7/2000 | Ben-Efraim et al. | |
| 6,194,929 B1 * | 2/2001 | Drost et al. | 327/156 |
| 6,259,295 B1 | 7/2001 | Kriz et al. | |
| 6,504,438 B1 * | 1/2003 | Chang et al. | 331/17 |
| 6,586,977 B2 | 7/2003 | Yang et al. | |
| 6,657,466 B1 | 12/2003 | Sudjian | |
| 6,670,833 B2 | 12/2003 | Kurd et al. | |
| 6,774,689 B1 * | 8/2004 | Sudjian | 327/158 |
| 6,961,546 B1 | 11/2005 | Rofougaran et al. | |
| 6,965,259 B2 | 11/2005 | Saeki | |
| 7,009,441 B2 | 3/2006 | Fiedler | |
| 7,075,353 B1 * | 7/2006 | Wan et al. | 327/295 |
| 7,437,137 B2 | 10/2008 | Fiedler | |
| 2004/0160265 A1 | 8/2004 | Fiedler | |
| 2005/0073369 A1 | 4/2005 | Balboni et al. | |
| 2005/0221785 A1 | 10/2005 | Fiedler | |
| 2006/0014510 A1 | 1/2006 | Yamamoto et al. | |
| 2006/0084386 A1 | 4/2006 | Irie et al. | |

FOREIGN PATENT DOCUMENTS

WO  WO 2005/034356 A2  4/2005

* cited by examiner

*Primary Examiner*—Khanh C Tran
(74) *Attorney, Agent, or Firm*—Patterson, Thuente, Skaar & Christensen, P.A.

(57) ABSTRACT

A phase control circuit includes a signal generator sub-circuit that generates a set of phase reference signals having phase angles generally distributed over a phase angle adjustment range. A controller sub-circuit produces weighting signals that assign relative priority for each of the phase reference signals, and includes at least one incremental adjustment input. The controller sub-circuit is adapted to maintain the weighting signals in a generally steady state when receiving signaling on the adjustment input that represents no adjustment, and to adjust relative intensities of the weighting signals based on stimulation of the adjustment input. The phase control circuit further includes a mixer sub-circuit that is coupled to the set of phase reference signals and to weighting signals that collectively control a mix of the phase reference signals. The mixer sub-circuit is adapted to produce an output signal having a phase angle that is based on the mix of the phase reference signals.

20 Claims, 14 Drawing Sheets

Mixer with Up/Down Phase Control Input

Variable-Strength Buffer Cell

Mixer Control Subcircuit A

Mixer Reset Circuit

Single-Phase Clock Recovery System

Mixer with Multiple UP/DOWN Phase Control Inputs

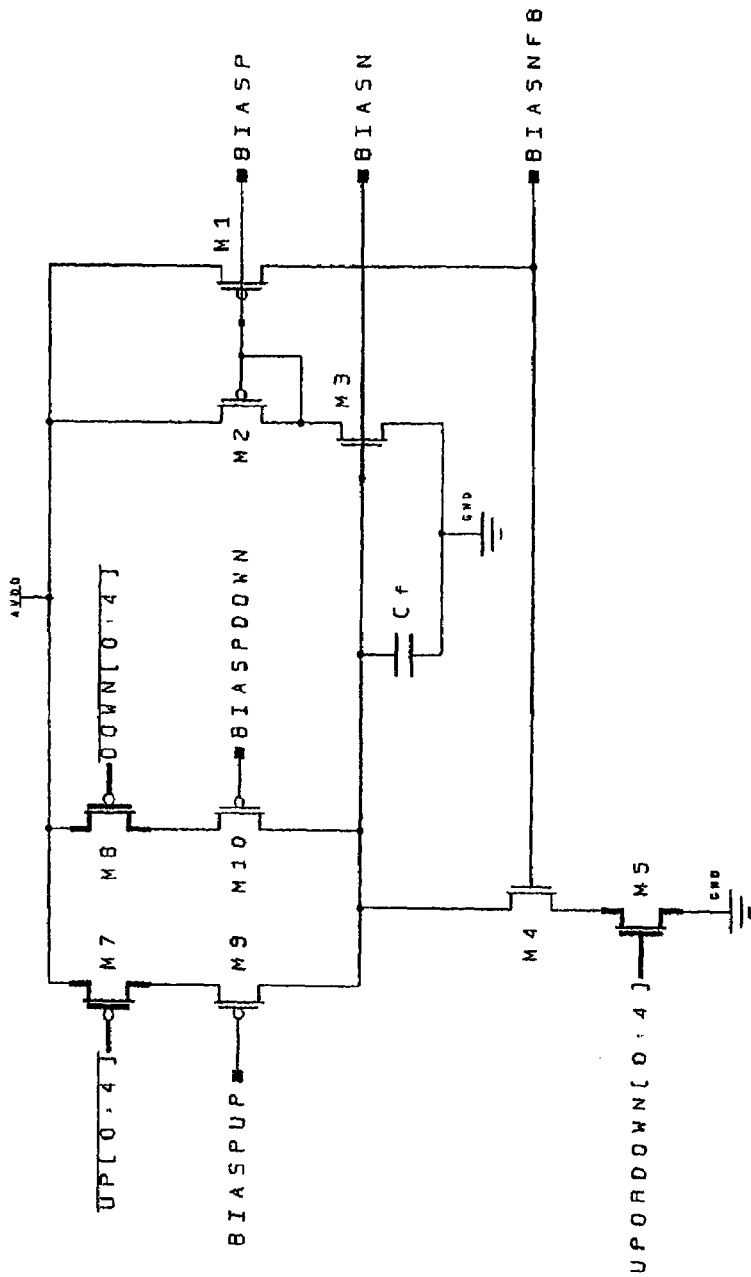

Multi – Phase Clock Recovery System

MIXER-BASED PHASE CONTROL

THE FIELD OF THE INVENTION

The present invention generally relates to integrated circuits, and more particularly to a mixer having up/down phase control, and systems and methods utilizing such a mixer. In one embodiment, the present invention provides a system and method for clock extraction from serial data.

BACKGROUND OF THE INVENTION

A mixer is generally used to combine two or more input signals to form a single output signal. These input signals can differ in frequency and phase, or in phase only. By selectively weighting the combination of these input signals, and in some cases varying those weights in time, a useful and complex output signal can be generated. A mixer with multiple inputs of equal frequency and distributed phase can generate an output signal of a similar frequency and of any phase through the selective weighting of each mixer input. To form a clock recovery system, it is desirable to have a mixer where the selective weighting of the mixer inputs can be directly controlled by a traditional data phase detector and its UP/DOWN logic outputs.

SUMMARY OF THE INVENTION

According to one aspect of the invention, a phase control circuit includes a signal generator sub-circuit that generates a set of phase reference signals having phase angles generally distributed over a phase angle adjustment range. A mixer sub-circuit is coupled to the set of phase reference signals and to weighting signals that collectively control a mix of the phase reference signals. The mixer sub-circuit is adapted to produce an output signal having a phase angle that is based on the mix of the phase reference signals. The phase control circuit further includes a controller sub-circuit that produces the weighting signals, and includes at least one adjustment input. The controller sub-circuit is adapted to maintain the weighing signals in a generally steady state when receiving signaling on the adjustment input that represents no adjustment, and to adjust relative intensities of the weighting signals based on stimulation of the adjustment input.

According to another aspect of the invention, a mixer control circuit includes an arrayed set of control signal driver elements, each element having a set of at least one UP/DOWN input that receives UPI/DOWN signaling common to all array elements, a feedback loop that receives a feedback signal common to all array elements representing at least an aggregation of control signal outputs of the array elements, a set of at least one control signal input that receives control signal outputs from other elements of the array, and a set of at least one control signal output that produces at least one control signal. The at least one control signal is produced such that an aggregation of the control signals of the array is proportional to a reference amplitude signal according to a first ratio. Also, a control signal having the highest amplitude among the control signals of the array is proportional to the reference amplitude signal according to a second ratio. Furthermore, a signal pulse on the at least one UP/DOWN input affects relative amplitudes of the control signals driven by the array elements.

A method of recovering a clock from a high-speed serial data transmission according to another aspect of the invention includes generating a plurality of phase reference signals, and controlling an amplitude of each of the phase reference signals to assign a relative weight to each of the phase reference signals. The controlling includes generating a plurality of amplitude control signals corresponding to the plurality of phase reference signals; stabilizing relative and absolute amplitudes of the amplitude control signals to maintain steady state in an absence of a change in input signal; interrelating the amplitude control signals such that a change in any one amplitude control signal propagates to effect changes in the other amplitude control signals; mixing the weighted phase reference signals to produce a local clock signal having a desired phase angle; and providing an input signal representing a comparison between the local clock signal and the serial data transmission.

BRIEF DESCRIPTION OF THE DRAWINGS

FIG. 8 illustrates one exemplary embodiment of mixer control subcircuit B.

DESCRIPTION OF THE PREFERRED EMBODIMENTS

Figure 1:
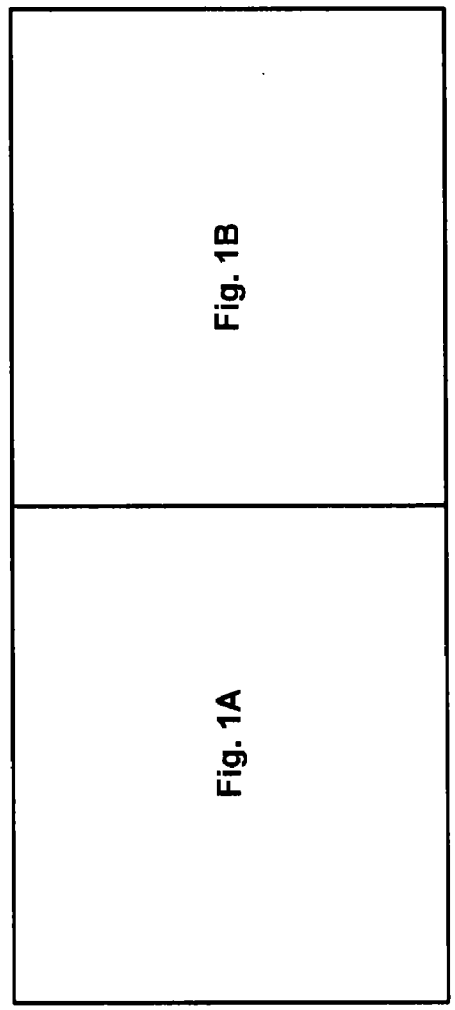
FIG. 1 illustrates one exemplary embodiment of a mixer with up/down phase control, built from a multi-phase mixer and an array of mixer control subcircuit A, according to the present invention.
Figure 1A:
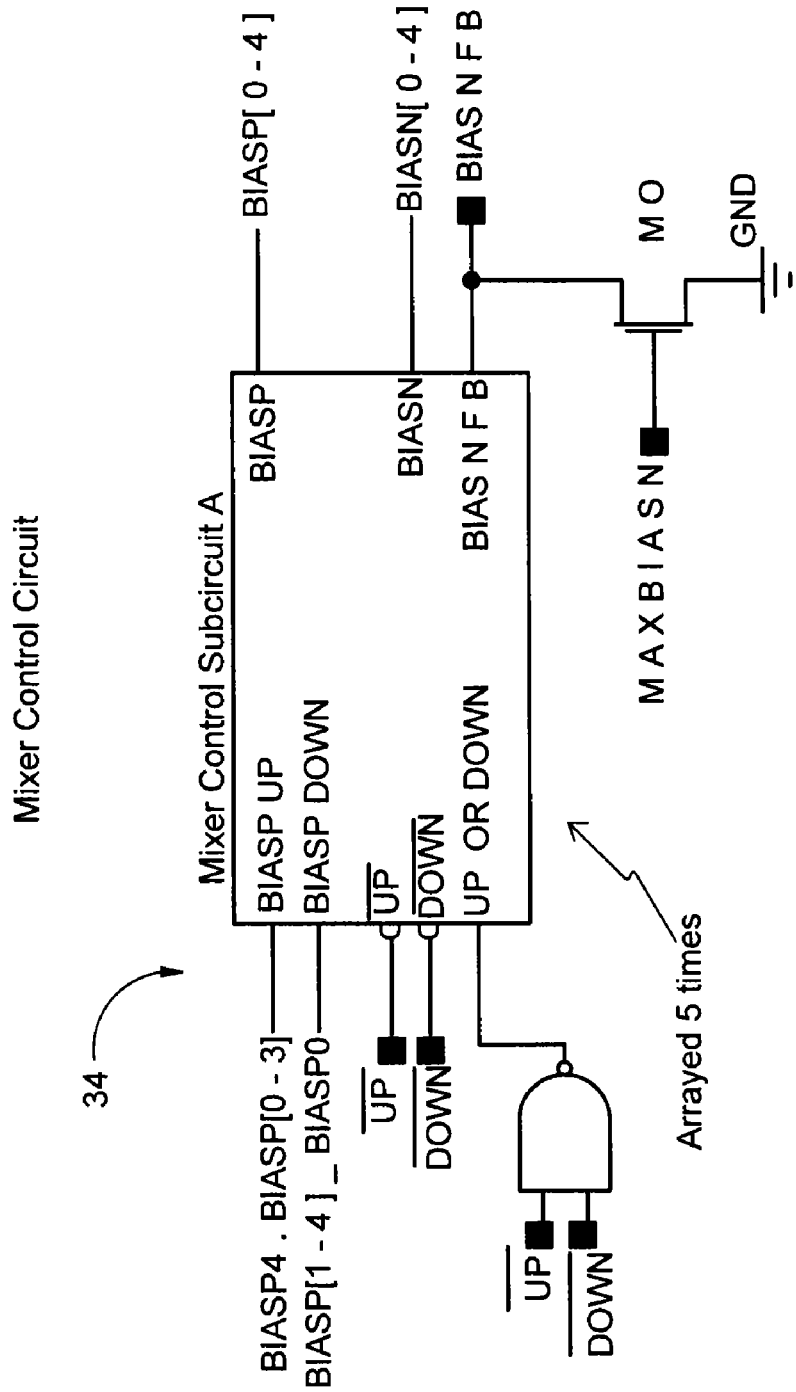
Figure 1B:
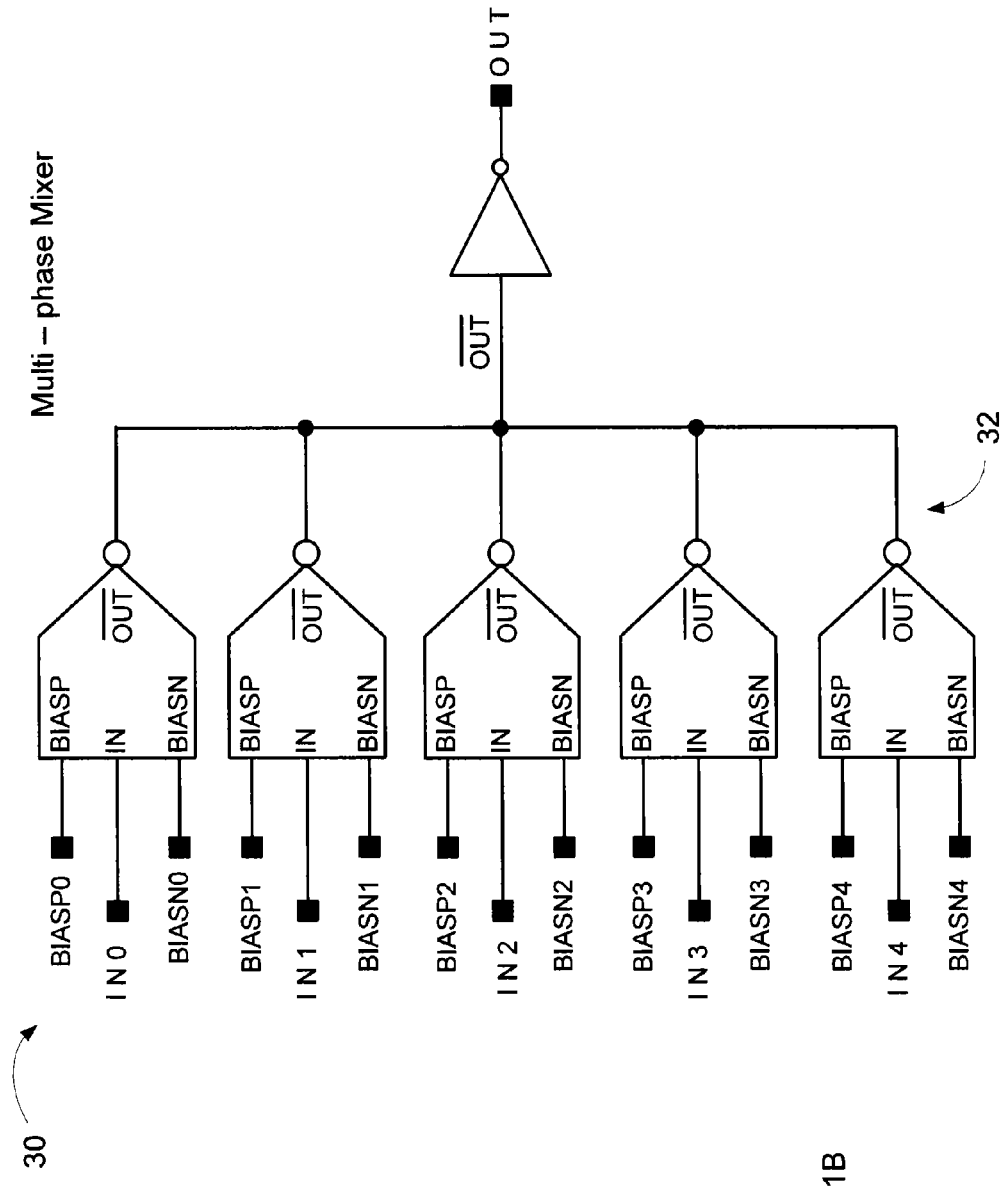

In the following detailed description of the preferred embodiments, reference is made to the accompanying drawings which form a part hereof, and in which is shown by way of illustration specific embodiments in which the invention may be practiced. It is to be understood that other embodiments may be used and structural or logical changes may be made without departing from the scope of the present invention. The following detailed description, therefore, is not to be taken in a limiting sense, and the scope of the present invention is defined by the appended claims.

One aspect of the present invention is directed to a signal mixer in which the selective weighting of each mixer input is controlled by incremental up/down adjustment. To form a clock recovery loop in one application, the mixer output can be coupled to the clock input of a data phase detector, while the data phase detector output is coupled to the up and down inputs of the mixer. The clock recovery loop controls the phase and therefore the frequency of the mixer output such that these are matched, or locked, to the incoming serial data.

In a related embodiment, the selective weights applied to each mixer input are controlled by multiple up inputs and multiple down inputs. Certain specialized data phase detectors use multiple phase sampling methods and will generate multiple up and down output signals. This embodiment is intended to couple to this specialized type of data phase detector.

One embodiment of the invention is a mixer comprising multiple mixer buffer cells whose outputs are coupled together; a common-mode feedback loop, ensuring that the net strength of the mixer buffer cells results in a mixer bandwidth that substantially matches the frequency of the signal being mixed; and a control loop which in steady-state results in a specific subset of the mixer buffer cells having a substantially high drive strength, with the remainder having a substantially low drive strength. The mixer buffer cell may further comprise a signal input, a signal output, and one or more additional inputs for controlling its output drive strength. Likewise, in the common-mode feedback loop the frequency of the signal being mixed may be converted to a voltage by means of a delay-locked loop, and this voltage may be used to control the mixer bandwidth. The control loop may further comprise control inputs $\overline{UP}$ and $\overline{DOWN}$ which when asserted results in a shift in the strength of the mixer buffer cells, resulting in a shift in output phase.

In another embodiment, the invention includes a mixer comprising a mixer similar to the mixer described above and additional $\overline{UP}$ and $\overline{DOWN}$ control inputs, operating in parallel with and with similar function as the $\overline{UP}$ and $\overline{DOWN}$ inputs described above.

Another embodiment of the invention comprises a single-phase clock recovery system including: a data phase detector; a multi-phase clock generator; and a mixer similar to that described above coupled to the data phase detector and the multi-phase clock generator. One embodiment is a multi-phase clock recovery system comprising a multi-phase data phase detector; a multi-phase clock generator; a second multi-phase clock generator; and a mixer similar to that set forth above, coupled to the data phase detector and the multi-phase clock generators.

Figure 2:
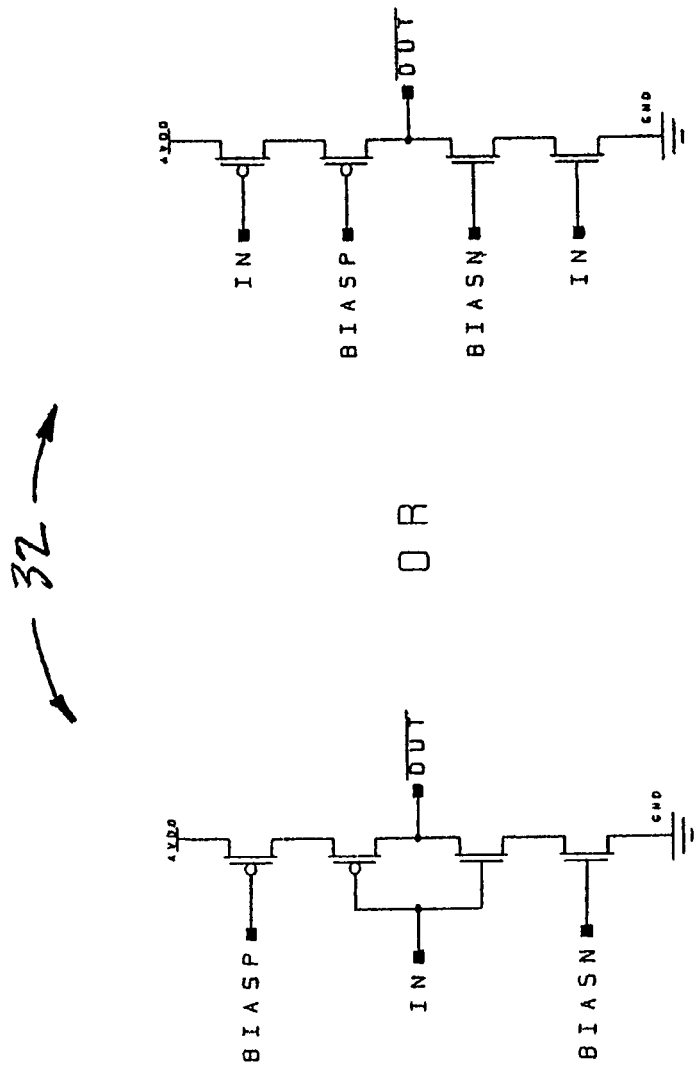
FIG. 2 illustrates exemplary embodiments of two buffer cells from which the mixer can be built.

FIG. 1 illustrates one example embodiment of a mixer according to one aspect of the present invention. The multi-phase mixer 30 of FIG. 1 is built from 5 variable strength buffer cells 32 whose outputs ate coupled together. The input signals IN[0:4] are nominally 50% duty-cycle input signals of varying phase, generally evenly distributed about 360 degrees. The accuracy of this distribution is not especially important. The drive strength of each variable-strength buffer cell is set by the voltage on its BIASN and BIASP inputs. FIG. 2 illustrates two exemplary embodiments of a variable-strength buffer cell 32. These are both inverting circuits, and can be used separately or in combination. By selectively strengthening one or more of the variable-strength buffer cells 32 and weakening others, the phase of the signal at $\overline{OUT}$ can be set to any value. An optional inverter coupled between $\overline{OUT}$ and OUT can provide for higher mixer output drive capability and a reduction in the mixer's output rise/fall time.

Also shown in FIG. 1 is one embodiment of a mixer control circuit 34. In one sense, this circuit is an analog state machine controlled by logic control inputs $\overline{UP}$ and $\overline{DOWN}$. The voltage on MAXBIASN assists in the control of the voltages of BIASN[0:4] such that $\Sigma V_{BIASN[0:4]} = K * V_{MAXBIASN}$, where this factor K is determined in part by the ratio of certain transistor W/L values. By controlling $\Sigma V_{BIASN[0:4]}$, the total drive current at $\overline{OUT}$ is controlled, and then so is the bandwidth at $\overline{OUT}$. For good operation of the mixer, its bandwidth is set to substantially the frequency of the input signals IN[0:4]. To achieve this, the voltage $V_{MAXBIASN}$ can be derived, for example, from the control voltage of a delay-locked loop operating at the same frequency as the mixer.

Figure 3A:
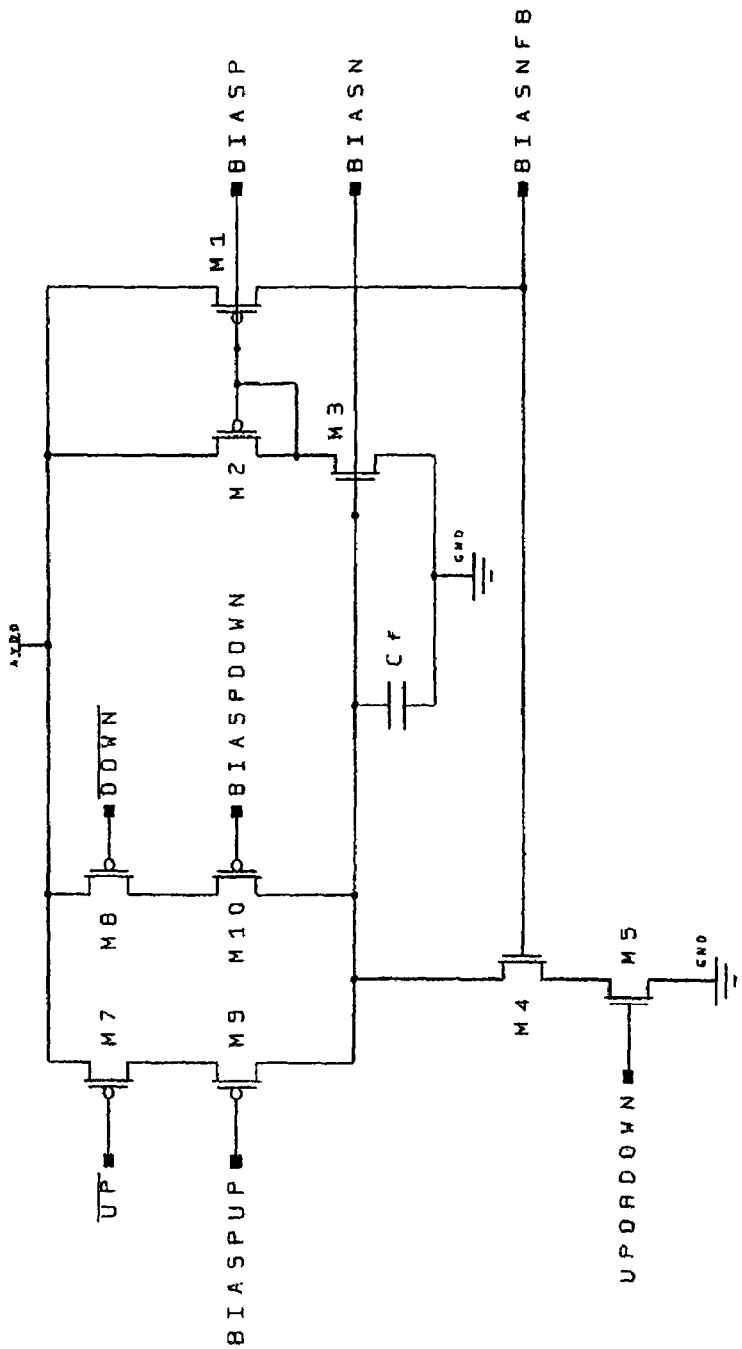
FIG. 3A illustrates one exemplary embodiment of mixer control subcircuit A.
Figure 3B:
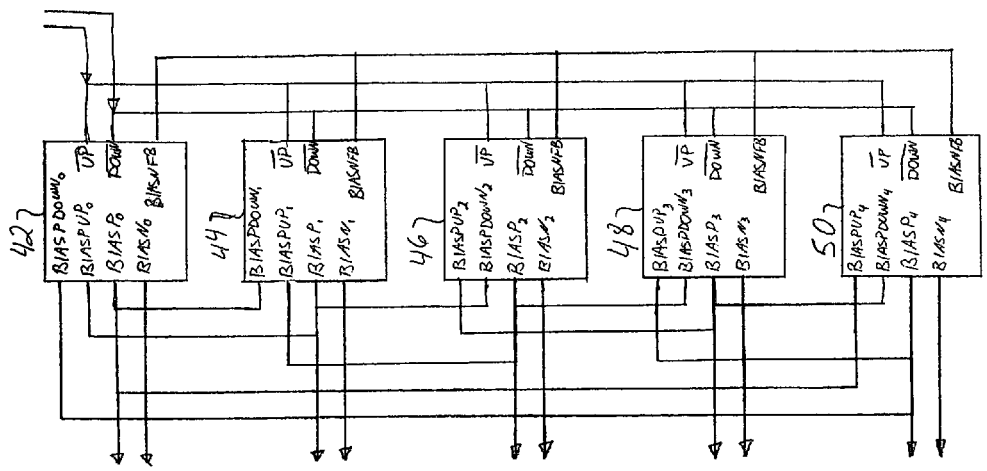
FIG. 3B is a block diagram illustrating one exemplary arrayed arrangement of mixer control subcircuits A.

FIG. 3A illustrates one exemplary embodiment of mixer control sub-circuit A that is arrayed 5 times as indicated in FIG. 1. FIG. 3B is a block diagram illustrating the organization and interconnectivity of the elements of the array according to one embodiment. The array of FIG. 3B includes blocks 42, 44, 46, 48, and 50, each of which represents the sub-circuit of FIG. 3A. The array can be through of as a one-dimensional array of adjacent interconnected blocks, in which block 42 is interconnected with block 50 as if these blocks were physically adjacent. Persons skilled in the relevant arts will recognize that the blocks can be functionally, or operably adjacent without being actually physically adjacent with one another in an integrated circuit (IC). For each block, or array element, the $\overline{UP}$ and $\overline{DOWN}$ inputs are commonly interconnected, as illustrated. Likewise, the BIASNFB input is common to all blocks.

Referring again to FIG. 3A, the voltages BIASN[0:4] are aggregated to achieve a signal representing the total output. In the embodiment shown, the voltages are summed by means of first converting each to a current (using M3), then mirroring each current (using M2 and M1) and summing those currents at BIASNFB. By means of a common-mode feedback loop including transistors M1-M5, and by setting W/L of M1 equal to W/L of M2 and W/L of M0 (in FIG. 1) equal to 2 times W/L of M3, the voltage on BIASNFB will settle to a voltage such that $\Sigma I_{M3} = I_{M0}$. Other ratios of M0 to M3 other than 2 can also be used with good results.

In addition to the conmon-mode feedback loop, there is a second loop which controls the voltage relationship between each element in BIASN[0:4]. The BIASPUP and BIASPDOWN inputs of each mixer control subcircuit are connected to the BIASP outputs of an adjacent mixer control subcircuit as follows: BIASPUP[N] is coupled to BIASP[N−1], and BIASPDOWN[N] is coupled to BLASP[N+1], for N=0, 1, 2, 3, 4 (where N+1=5, use 0). With both loops operational, FIG. 4a shows a representative steady-state condition for BIASN[0:4]. Referring again to the arrayed mixer control subcircuit of FIGS. 3A and 3B, consider what happens to the state of BLASN[0:4] in FIG. 4a when a $\overline{DOWN}$ pulse is applied: BIASN3 will receive a pulse of current proportional to $V_{BIASN2}$ by means of an inverting amplifier formed by M3 and M2 and coupling BIASN2 to BIASP2. This pulse of current is then integrated by capacitor Cf, raising $V_{BIASN3}$. In a similar fashion, BIASN2 will receive a brief pulse of current proportional to $V_{BIASN1}$, by means of the inverting amplifier formed by M3 and M2 and coupling BLASNI to BLASPI. This pulse of current is then integrated by another capacitor Cf, raising $V_{BIASN2}$, though by a lesser amount than $V_{BIASN3}$ was raised. Also, in a similar fashion, BIASN4 will receive a brief pulse of current proportional to $V_{BIASN3}$ by means of another inverting amplifier formed by M3 and M2 and coupling BIASN3 to BIASP3. This pulse of current is then integrated by another capacitor Cf, raising $V_{BIASN4}$, though again by a lesser amount than $V_{BIASN3}$ was raised. During the assertion of $\overline{DOWN}$ and at the same time that these described events which are tending to raise the voltage on some of the nets BIASN[0:4], all of these nets are discharged by an equal amount as determined by the common-mode feedback loop which includes discharge transistors M4 and M5.

FIG. 4b illustrates the state of $V_{BIASN[0:4]}$ after pulsing $\overline{DOWN}$ low for a period of time and giving rise to the events described above. And after pulsing $\overline{UP}$ low for a period of time and giving rise to events similar yet complementary to those described above, the state of $V_{BIASN[0:4]}$ is as illustrated in FIG. 4c.

Figure 4:
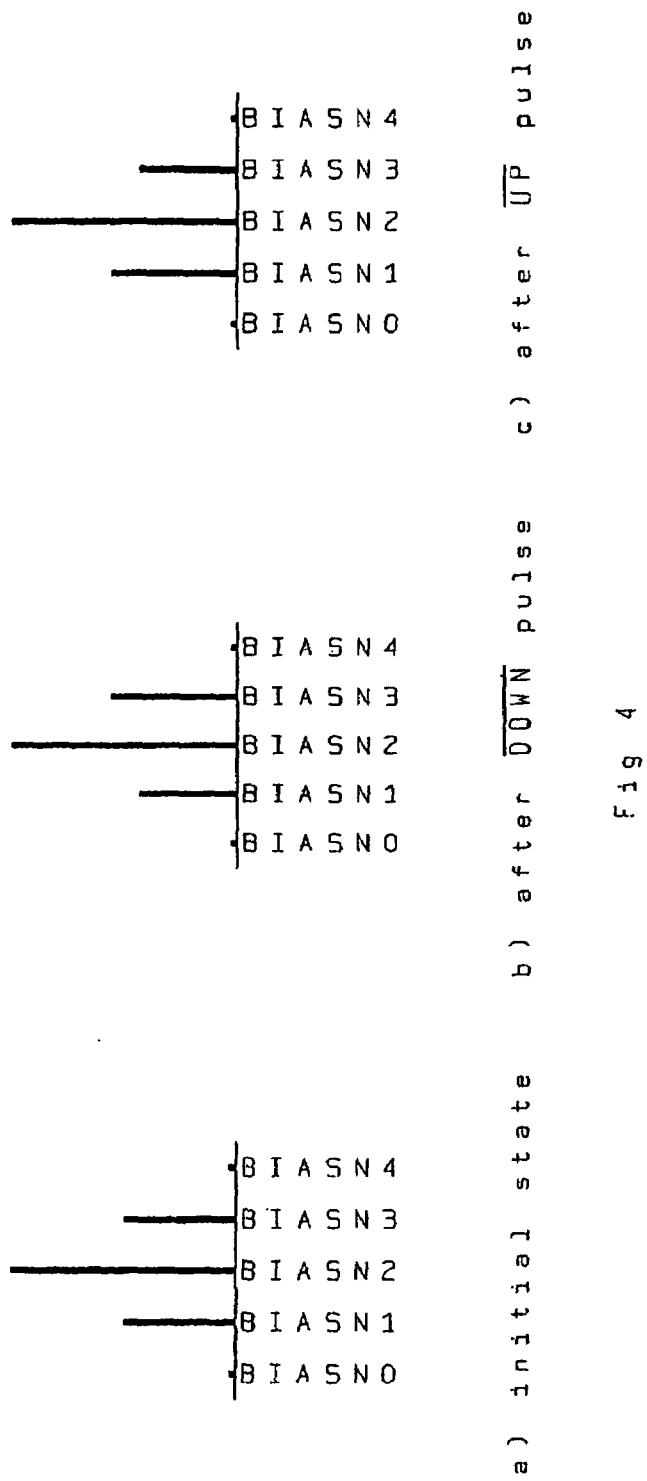
FIG. 4 illustrates exemplary embodiments of the voltage levels of BIASN[0:4] in an initial state, after a $\overline{\text{DOWN}}$ pulse, and after an $\overline{\text{UP}}$ pulse.

Note that each of the 3 states in FIG. 4 are stable and do not drift (say, to the state of FIG. 4a) when subject to no adjustment such as when receiving an equal percentage of $\overline{UP}$ and $\overline{DOWN}$ pulses. Put another way, there is no inherent systematic offset in this mixer control circuit, and this is of particular value when the mixer is integrated into a clock recovery loop.

Also note that this disclosure shows the mixing of P phases where P=5, though any number P≧3 can be used.

Figure 5:
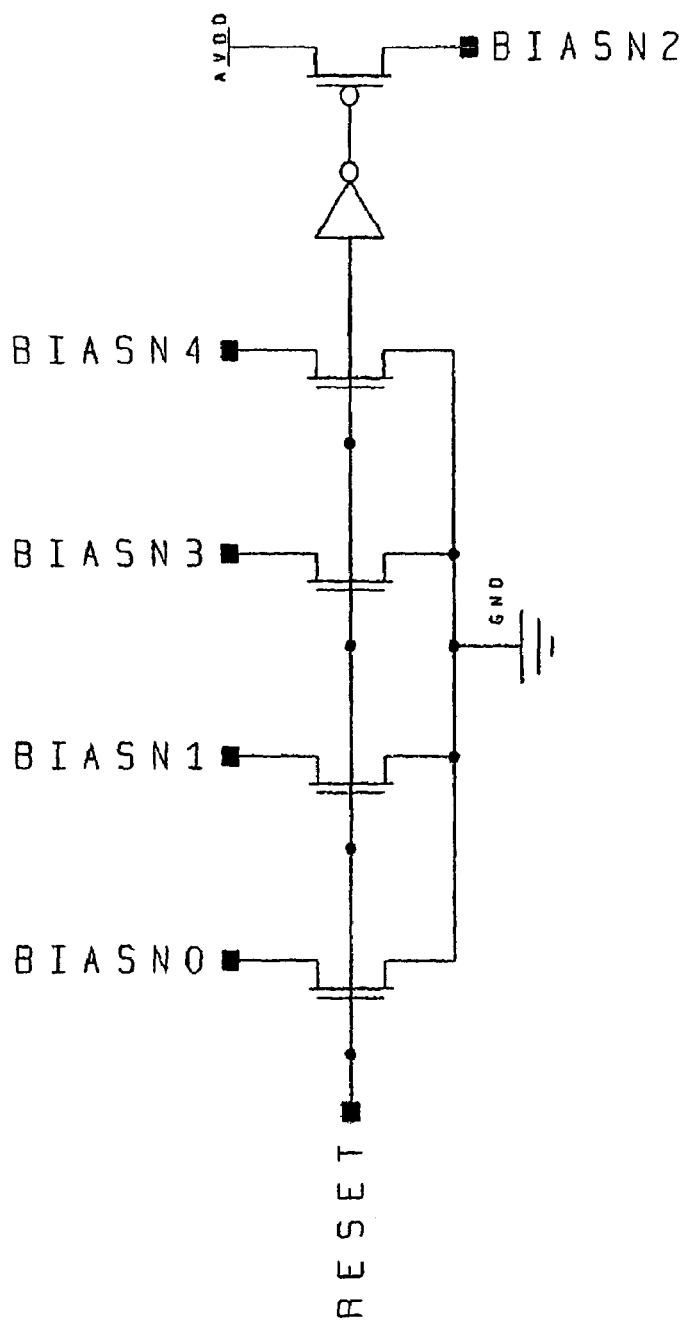
FIG. 5 illustrates one exemplary embodiment of a mixer reset circuit.

Also note that a reset or startup circuit is helpful to pull the circuit out of the undesirable state when $V_{BIASN[0:4]}$ all equal 0. The RESET circuit in FIG. 5 is suitable for use with the present invention, though other circuits are possible, and some do not require an explicit RESET input.

Figure 6:
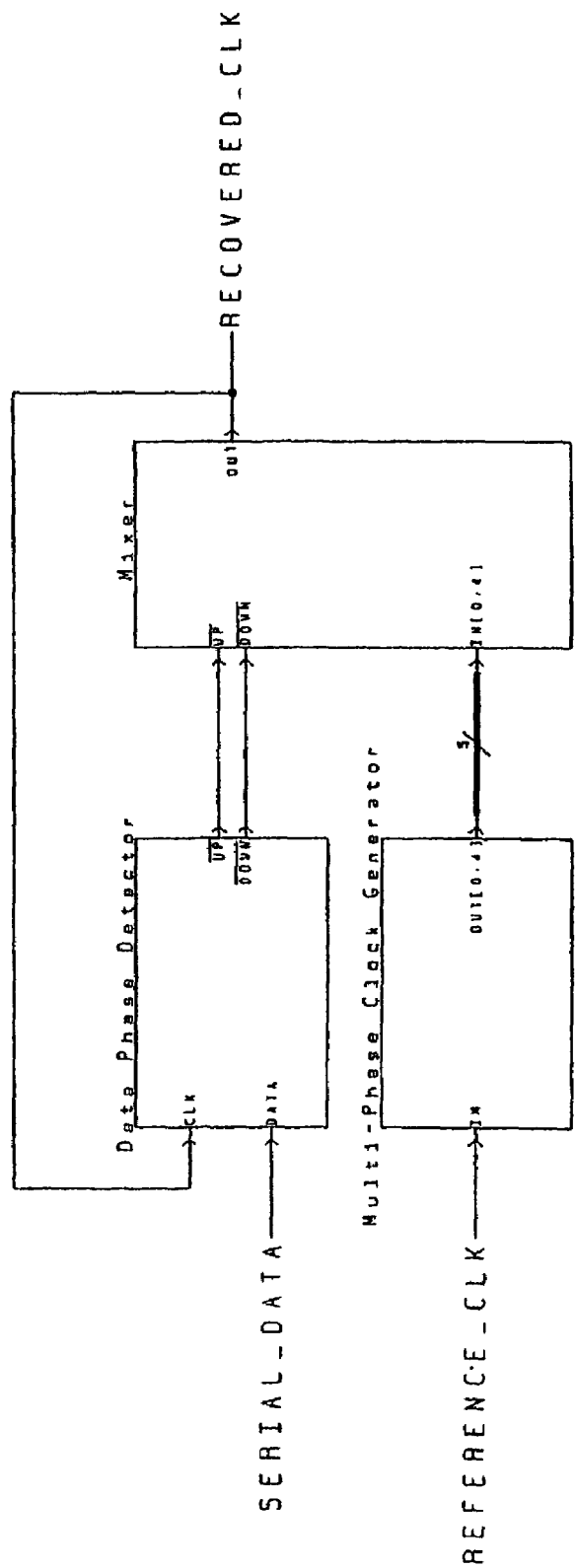
FIG. 6 illustrates one exemplary embodiment of a clock recovery system with a data phase detector using a single clock input and a mixer with a single $\overline{\text{UP}}$ and a single $\overline{\text{DOWN}}$ input, according to the present invention.

FIG. 6 illustrates a clock recovery system using a mixer according to the present invention. The mixer is coupled between a data phase detector having DATA and CLK inputs and $\overline{UP}$ and $\overline{DOWN}$ outputs. The system will adjust the phase of the recovered clock until its phase and frequency match that of the incoming data. A multi-phase clock generator is used to generate the mixer's clock inputs from a single reference clock.

Figure 7:
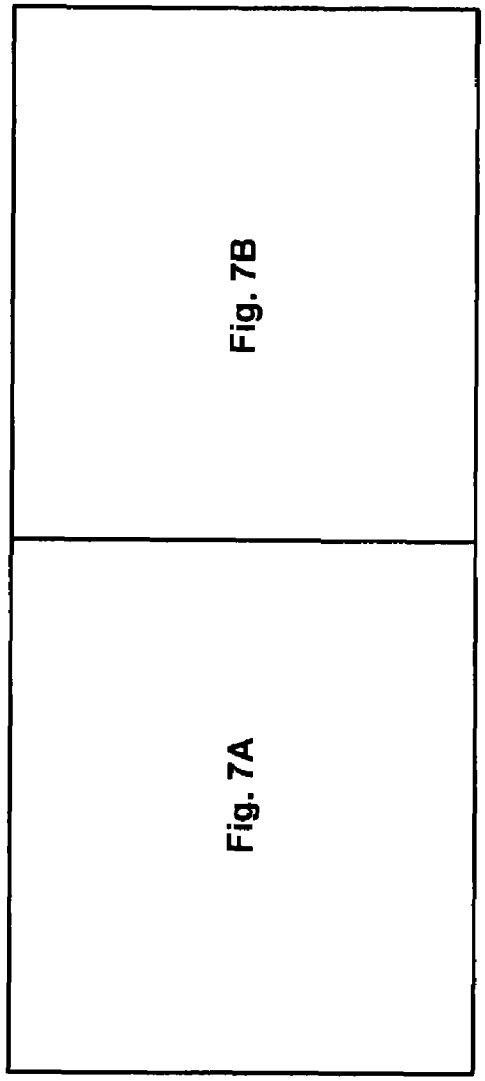
FIG. 7 illustrates one exemplary embodiment of a mixer with multiple up/down phase control inputs, built from a multi-phase mixer and mixer control subcircuit B.
Figure 7A:
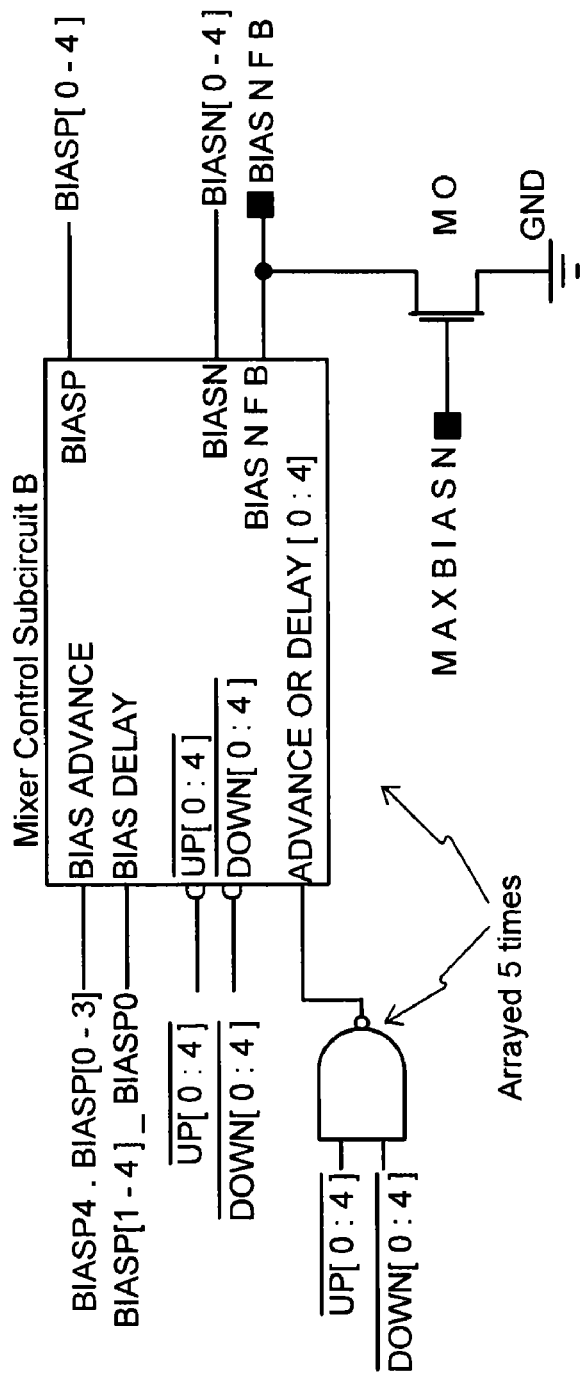
Figure 7B:
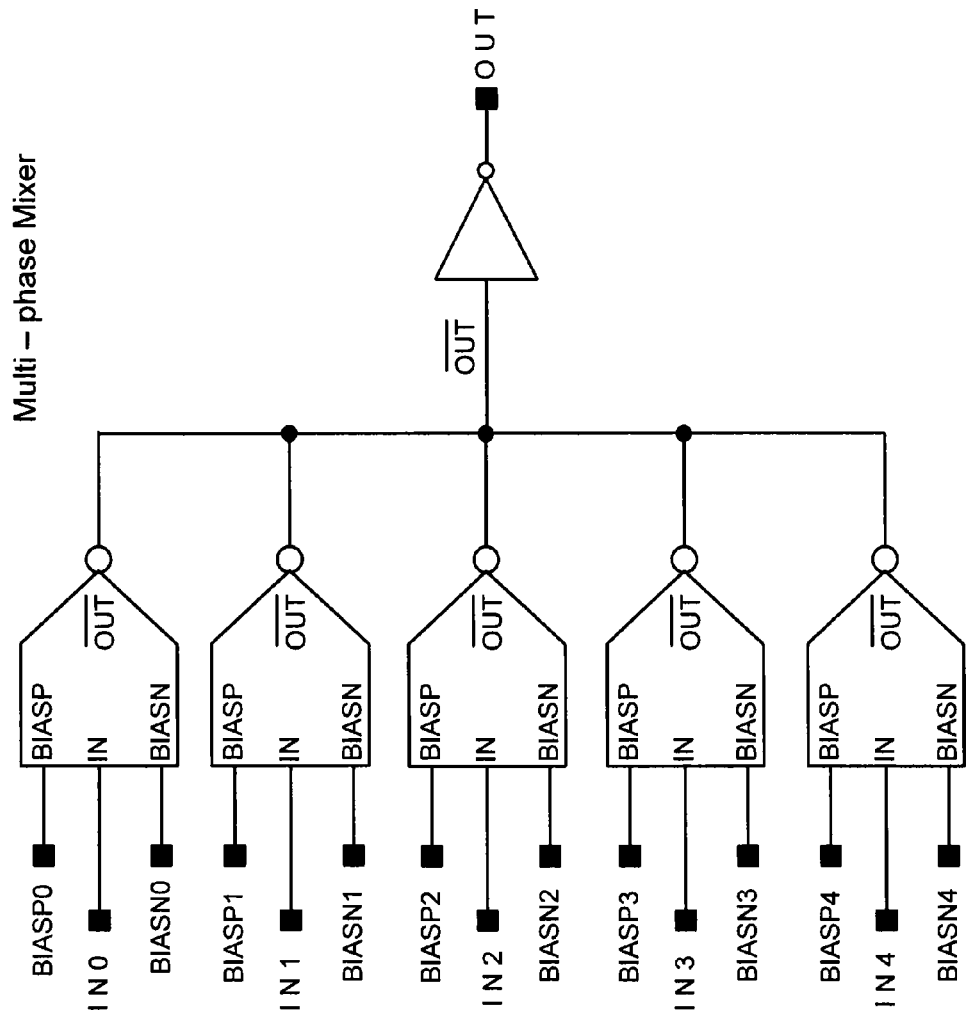

FIG. 7 illustrates another embodiment of a mixer, similar to that in FIG. 1, but with multiple $\overline{UP}$ and $\overline{DOWN}$ phase control inputs. This mixer uses a new mixer control subcircuit B, illustrated in FIG. 8. Here, M5, M7, and M8 consist of arrays of 5 transistors connected in parallel. For example, M7 indicates an array of 5 transistors with the drains shorted together, the sources shorted together, and the gates coupled to the bus $\overline{UP[0:4]}$.

Figure 9:
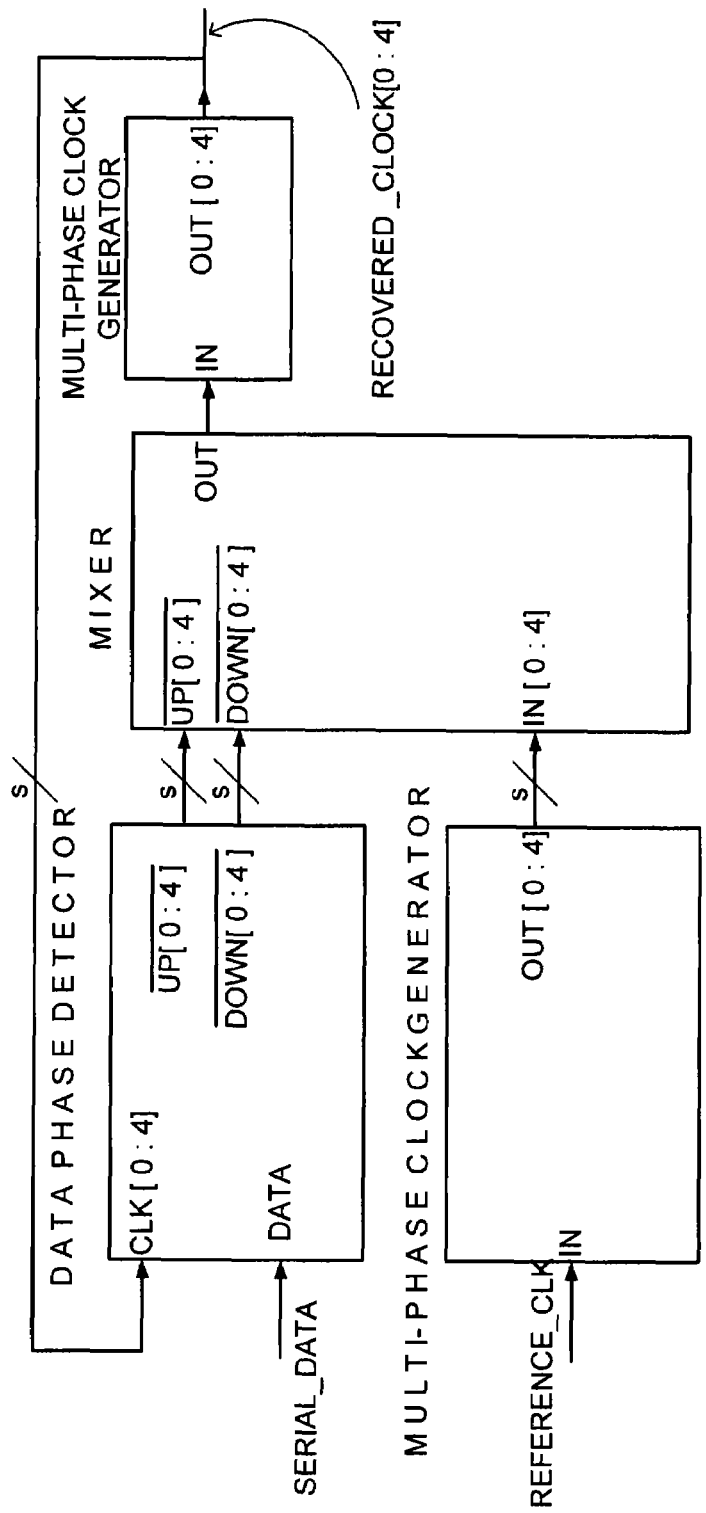
FIG. 9 illustrates one exemplary embodiment of a clock recovery system with a data phase detector using a multi-phase clock input and a mixer with multiple $\overline{\text{UP}}$ inputs and multiple $\overline{\text{DOWN}}$ inputs.

This new mixer is used in an alternate clock recovery system, illustrated in FIG. 9. Here, the clock recovery system uses a specialized data phase detector having multiple CLK inputs and multiple $\overline{UP}$ and $\overline{DOWN}$ outputs. To generate the multiple clock phases used by this specialized data phase detector, a second multiphase clock generator is used and is coupled between the mixer output and the data phase detector. Though both are shown here to be equal to 5, the number of phases in the two multi-phase clock generators do not necessarily need to be equal.

Although specific embodiments have been illustrated and described herein for purposes of description of the preferred embodiment, it will be appreciated by those of ordinary skill in the art that a wide variety of alternate and/or equivalent implementations may be substituted for the specific embodiments shown and described without departing from the scope of the present invention. Those with skill in the chemical, mechanical, electro-mechanical, electrical, and computer arts will readily appreciate that the present invention may be implemented in a very wide variety of embodiments. This application is intended to cover any adaptations or variations of the preferred embodiments discussed herein.

What is claimed is:

1. A phase control circuit, comprising:
   a signal generator sub-circuit that generates a set of phase reference signals having phase angles generally distributed over a phase angle adjustment range;
   a controller sub-circuit that produces weighting signals that assign relative priority for each of the phase reference signals, wherein the controller sub-circuit includes at least one incremental adjustment input and is adapted to: maintain the weighting signals in a generally steady state when receiving signaling on the at least one incremental adjustment input that represents no adjustment; and adjust relative intensities of the weighting signals based on incremental adjustment signaling at the adjustment input; and
   a mixer sub-circuit operably coupled to the set of phase reference signals and to the weighting signals to collectively control a mix of the set of phase reference signals, wherein the mixer sub-circuit is adapted to produce an output signal having a phase angle that is based on the mix of the set of phase reference signals.

2. The phase control circuit of claim 1, wherein the phase angle adjustment range is 360 degrees.

3. The phase control circuit of claim 1, wherein the controller sub-circuit includes an array of inter-coupled charge pump circuits.

4. The phase control circuit of claim 1, wherein the controller sub-circuit includes an analog state-machine responsive to logic control signaling on the incremental adjustment input.

5. The phase control circuit of claim 1, wherein the phase control circuit is an integrated circuit.

6. The phase control circuit of claim 1, wherein the controller sub-circuit includes a first feedback sub-circuit for stabilizing an aggregate amplitude of the weighting signals, and a second feedback sub-circuit for stabilizing a relative amplitude of the weighting signals.

7. The phase control circuit of claim 1, wherein the incremental adjustment input is coupled to an output of a phase detector circuit.

8. A mixer control circuit, comprising:
   a reference amplitude signal; and
   an arrayed set of control signal driver elements, each element having: a set of at least one UP/DOWN input that receives UP/DOWN signaling common to all elements of the arrayed set;
   a feedback loop that receives a feedback signal common to all elements of the arrayed set, the feedback signal representing at least an aggregation of control signal outputs of the elements of the arrayed set;
   a set of at least one control signal input that receives control signal outputs from other elements of the arrayed set; and
   a set of at least one control signal output that produces at least one control signal such that: an aggregation of the control signals of the arrayed set is proportional to the reference amplitude signal according to a first ratio;
   a control signal having a highest amplitude among the control signals of the arrayed set is proportional to the reference amplitude signal according to a second ratio; and
   a signal pulse on the at least one UP/DOWN input affects relative amplitudes of the control signals driven by the elements of the arrayed set.

9. The mixer control circuit of claim 8, wherein the reference amplitude signal affects the feedback signal.

10. The mixer control circuit of claim 8, wherein the set of at least one UP/DOWN input includes a pair of distinct UP and DOWN inputs.

11. The mixer control circuit of claim 8, wherein the set of at least one UP/DOWN input includes an array of a plurality of UP/DOWN inputs.

12. The mixer control circuit of claim 8, wherein the UP/DOWN signaling is binary logic signaling.

13. The mixer control circuit of claim 8, wherein the amplitude of the control signal having the highest amplitude matches the amplitude of the reference amplitude signal.

14. The mixer control circuit of claim 8, wherein the circuit is adapted to adjust the individual control signal amplitudes such that an aggregation of control signals that includes at least one control signal from each array element is equal to twice the amplitude of the reference amplitude signal.

15. The mixer control circuit of claim 8, wherein the set of at least one control signal output for each elements of the arrayed sets includes a pair of related control signal outputs.

16. The mixer control circuit of claim 8, further comprising a charge pump arrangement in each element of the arrayed set.

17. The mixer control circuit of claim 8, further comprising an integrator arrangement in each element of the arrayed set.

18. The mixer control circuit of claim 8, wherein the arrayed set is a one-dimensional array of N control signal driver elements, wherein each element is functionally adjacent to two different other elements such that element 1 is adjacent to element N, wherein the set of at least one control signal input for each element includes a first control signal input coupled to the control signal output of a first functionally adjacent element, and a second control signal input coupled to the control signal output of a second functionally adjacent element.

19. A method of recovering a clock from a high-speed serial data transmission circuit, the method comprising:

generating a plurality of phase reference signals in a generator circuit;

providing an input signal representing a comparison between a local clock signal and the serial data transmission circuit; and controlling an amplitude of each of the phase reference signals in the generator circuit to assign a relative weight to each of the phase reference signals by: generating a plurality of amplitude control signals corresponding to the plurality of phase reference signals in the generator circuit;

stabilizing relative and absolute amplitudes of the amplitude control signals to maintain steady state in an absence of a change in the input signal;

inter-relating the amplitude control signals such that a change in any one amplitude control signal propagates to effect changes in the other amplitude control signals; and mixing the weighted phase reference signals to produce the local clock signal having a desired phase angle.

20. The method of claim 19, wherein the step of stabilizing includes: maintaining a first amplitude ratio between a maximum amplitude control signal and other amplitude control signals; maintaining a second amplitude ratio between a sum of amplitudes of the amplitude control signals and an amplitude reference signal; and maintaining a third amplitude ratio between the maximum amplitude control signal and the amplitude reference signal.

* * * * *